(12) United States Patent
Nishiguchi et al.

(10) Patent No.: US 12,249,543 B2
(45) Date of Patent: Mar. 11, 2025

(54) SEMICONDUCTOR DEVICE INCLUDING PLURALITY OF GATE FINGERS WITH VARIOUS LEVELS

(71) Applicant: Sumitomo Electric Industries, Ltd., Osaka (JP)

(72) Inventors: Kenya Nishiguchi, Osaka (JP); Akihiro Hayasaka, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 411 days.

(21) Appl. No.: 17/842,890

(22) Filed: Jun. 17, 2022

(65) Prior Publication Data
US 2023/0068932 A1 Mar. 2, 2023

(30) Foreign Application Priority Data

Aug. 27, 2021 (JP) .................................. 2021-138911

(51) Int. Cl.
| | | |
|---|---|---|
| *H01L 21/8234* | (2006.01) | |
| *H01L 23/367* | (2006.01) | |
| *H01L 23/66* | (2006.01) | |
| *H01L 27/088* | (2006.01) | |
| *H01L 29/417* | (2006.01) | |
| *H01L 29/423* | (2006.01) | |

(Continued)

(52) U.S. Cl.
CPC .............. *H01L 21/823456* (2013.01); *H01L 21/823437* (2013.01); *H01L 21/823462* (2013.01); *H01L 23/367* (2013.01); *H01L 23/66* (2013.01); *H01L 27/088* (2013.01); *H01L 29/41775* (2013.01); *H01L 29/42356* (2013.01); *H01L 29/42368* (2013.01); *H01L 29/2003* (2013.01); *H01L 29/7786* (2013.01); *H01L 2223/665* (2013.01)

(58) Field of Classification Search
CPC ..... H01L 21/823437; H01L 21/823456; H01L 21/823462; H01L 21/8252; H01L 23/367; H01L 23/4824; H01L 23/66; H01L 27/0605; H01L 27/088; H01L 29/2003; H01L 29/41775; H01L 29/42356; H01L 29/4236; H01L 29/42368; H01L 29/7786; H01L 2223/665

See application file for complete search history.

(56) References Cited

U.S. PATENT DOCUMENTS

| | | | |
|---|---|---|---|
| 10,381,984 B2 | 8/2019 | Wu et al. | |
| 2014/0342529 A1* | 11/2014 | Goktepeli | H01L 21/76256 |
| | | | 438/458 |
| 2020/0127627 A1 | 4/2020 | Trang et al. | |

* cited by examiner

*Primary Examiner* — Cheung Lee
(74) *Attorney, Agent, or Firm* — Volpe Koenig

(57) ABSTRACT

A semiconductor device includes a substrate, a channel layer provided on the substrate, a semiconductor layer provided on the channel layer, gate fingers and a gate connection wiring provided on the semiconductor layer, and an insulating film provided between the semiconductor layer and the gate fingers, wherein the gate fingers includes a first gate finger, and a second gate finger closer to the center of the gate fingers in an arrangement direction than the first gate finger, wherein a first distance between a lower surface of the first gate finger in contact with the insulating film and an upper surface of the channel layer in contact with the semiconductor layer is greater than a second distance between a lower surface of the second gate finger in contact with the insulating film and the upper surface of the channel layer in contact with the semiconductor layer.

10 Claims, 23 Drawing Sheets

(51) Int. Cl.
*H01L 29/20* (2006.01)
*H01L 29/778* (2006.01)

SEMICONDUCTOR DEVICE INCLUDING PLURALITY OF GATE FINGERS WITH VARIOUS LEVELS

CROSS REFERENCE TO RELATED APPLICATIONS

This application claims priority based on Japanese Patent Application No. 2021-138911 filed on Aug. 27, 2021, and the entire contents of the Japanese patent applications are incorporated herein by reference.

FIELD

The present disclosure relates to a semiconductor device, for example, a semiconductor device having a field effect transistor.

BACKGROUND

Field effect transistors (FETs) such as GaN HEMTs (Gallium Nitride High Electron Mobility Transistors) are used in high frequency power amplifiers for base stations. It is known that the layout of the FETs is a multi-finger type (for example, Patent Document 1: U.S. Unexamined Patent Application Publication No. 2020/0127627, Patent Document 2: U.S. patent Ser. No. 10/381,984).

SUMMARY

A semiconductor device according to the present disclosure includes: a substrate; a channel layer provided on the substrate; a semiconductor layer provided on the channel layer; a plurality of gate fingers provided on the semiconductor layer and arranged in an arrangement direction in a plan view from a vertical direction perpendicular to an upper surface of the substrate; a gate connection wiring provided on the semiconductor layer and to which the plurality of gate fingers are commonly connected; and an insulating film provided between the semiconductor layer and the plurality of gate fingers; wherein the plurality of gate fingers includes: a first gate finger; and a second gate finger closer to the center of the plurality of gate fingers in the arrangement direction than the first gate finger; wherein a first distance in the vertical direction between a lower surface of the first gate finger in contact with the insulating film and an upper surface of the channel layer in contact with the semiconductor layer is greater than a second distance in the vertical direction between a lower surface of the second gate finger in contact with the insulating film and the upper surface of the channel layer in contact with the semiconductor layer.

DETAILED DESCRIPTION OF EMBODIMENTS

Figure 1:
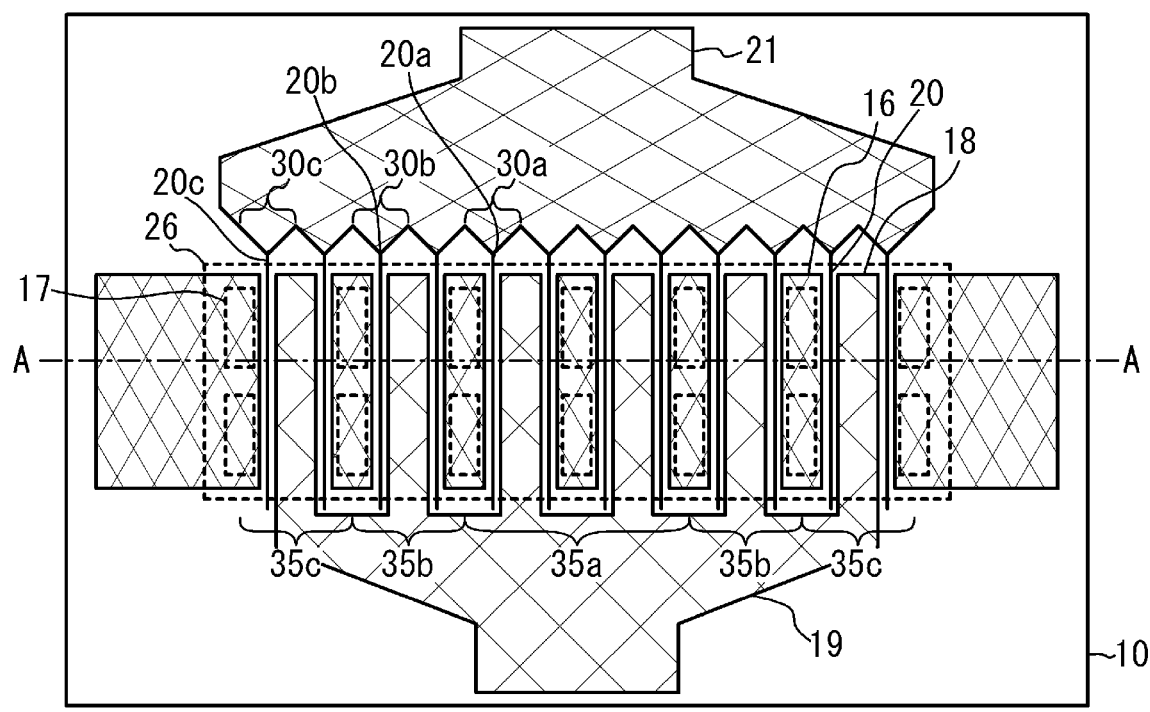
FIG. 1 is a plan view of the FET according to a first embodiment.
Figure 1:
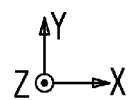

In multi-finger type FETs, increasing a density of gate fingers to reduce a chip area causes a temperature near the center of the plurality of gate fingers to increase. This causes the characteristics to deteriorate.

It is an object of the present disclosure to provide a semiconductor device that suppress an increase in temperature.

Description of Embodiments of the Present Disclosure

First, the contents of the embodiments of this disclosure are listed and explained.

(1) A semiconductor device according to the present disclosure includes: a substrate; a channel layer provided on the substrate; a semiconductor layer provided on the channel layer; a plurality of gate fingers provided on the semiconductor layer and arranged in an arrangement direction in a plan view from a vertical direction perpendicular to an upper surface of the substrate; a gate connection wiring provided on the semiconductor layer and to which the plurality of gate fingers are commonly connected; and an insulating film provided between the semiconductor layer and the plurality of gate fingers; wherein the plurality of gate fingers includes: a first gate finger; and a second gate finger closer to the center of the plurality of gate fingers in the arrangement direction than the first gate finger; wherein a first distance in the vertical direction between a lower surface of the first gate finger in contact with the insulating film and an upper surface of the channel layer in contact with the semiconductor layer is greater than a second distance in the vertical direction between a lower surface of the second gate finger in contact with the insulating film and the upper surface of the channel layer in contact with the semiconductor layer. Thereby, an increase in temperature can be suppressed.

(2) A first portion of the insulating film provided between the first gate finger and the semiconductor layer may be thicker than a second portion of the insulating film provided between the second gate finger and the semiconductor layer.

(3) A first portion of the semiconductor layer provided between the first gate finger and the channel layer may be thicker than a second portion of the semiconductor layer provided between the second gate finger and the channel layer.

(4) The plurality of gate fingers may include a third gate finger provided between the first gate finger and the second gate finger in a plan view from the vertical direction. A third distance in the vertical direction between a lower surface of the third gate finger in contact with the insulating film and the upper surface of the channel layer in contact with the semiconductor layer may be smaller than the first distance and larger than the second distance.

(5) In any adjacent gate fingers among the plurality of gate fingers in a plan view from the vertical direction, a fourth distance in the vertical direction between a lower surface of a gate finger, among the adjacent gate fingers, near the center in contact with the insulating film and the upper surface of the channel layer in contact with the semiconductor layer may be equal to or less than a fifth distance in the vertical direction between a lower surface of a gate finger, among the adjacent gate fingers, far from the center in contact with the insulating film and the upper surface of the channel layer in contact with the semiconductor layer.

(6) In a plan view from the vertical direction, an average of sixth distances in the vertical direction between the lower surface of the plurality of gate fingers in contact with the insulating film and the upper surface of the channel layer in contact with the semiconductor layer in a first region between the center and a midpoint between an outermost fourth gate finger in the arrangement direction among the plurality of gate fingers and the center may be smaller than an average value of seventh distances in the vertical direction between the lower surface of the plurality of gate fingers in contact with the insulating film and the upper surface of the channel layer in contact with the semiconductor layer in a second region between the midpoint and the fourth gate finger.

(7) An eighth distance in the vertical direction between the lower surface of the plurality of gate fingers in contact with the insulating film and the upper surface of the channel layer in contact with the semiconductor layer may have a plurality of levels. A level of the eighth distance in a region between the center and a midpoint between the center and an outermost fourth gate finger in the arrangement direction among the plurality of gate fingers may be the smallest in the plurality of levels.

(8) In a plan view from the vertical direction, a ninth distance in vertical direction between a lower surface of a central portion of the second gate finger in contact with the insulating film in an extension direction of the plurality of gate fingers and the upper surface of the channel layer in contact with the semiconductor layer may be smaller than a tenth distance in vertical direction between a lower surface of a peripheral portion of the second gate finger in contact with the insulating film in the extension direction and the upper surface of the channel layer in contact with the semiconductor layer.

(9) The semiconductor device may further include a plurality of source fingers provided on the semiconductor layer and arranged in the arrangement direction, and a plurality of drain fingers provided on the semiconductor layer and alternately provided with the plurality of source fingers in the arrangement direction, wherein in a plan view from the vertical direction, each of the plurality of gate fingers may be sandwiched between one of the plurality of source fingers and one of the plurality of drain fingers in the arrangement direction.

(10) The channel layer may include a two-dimensional electron gas formed at an interface between a first semiconductor layer and a second semiconductor layer having a larger bandgap than the first semiconductor layer.

Details of Embodiments of the Present Disclosure

Specific examples of a semiconductor device in accordance with embodiments of the present disclosure are described below with reference to the drawings. The present disclosure is not limited to these examples, but is indicated by the claims, which are intended to include all modifications within the meaning and scope of the claims.

First Embodiment

Figure 2:
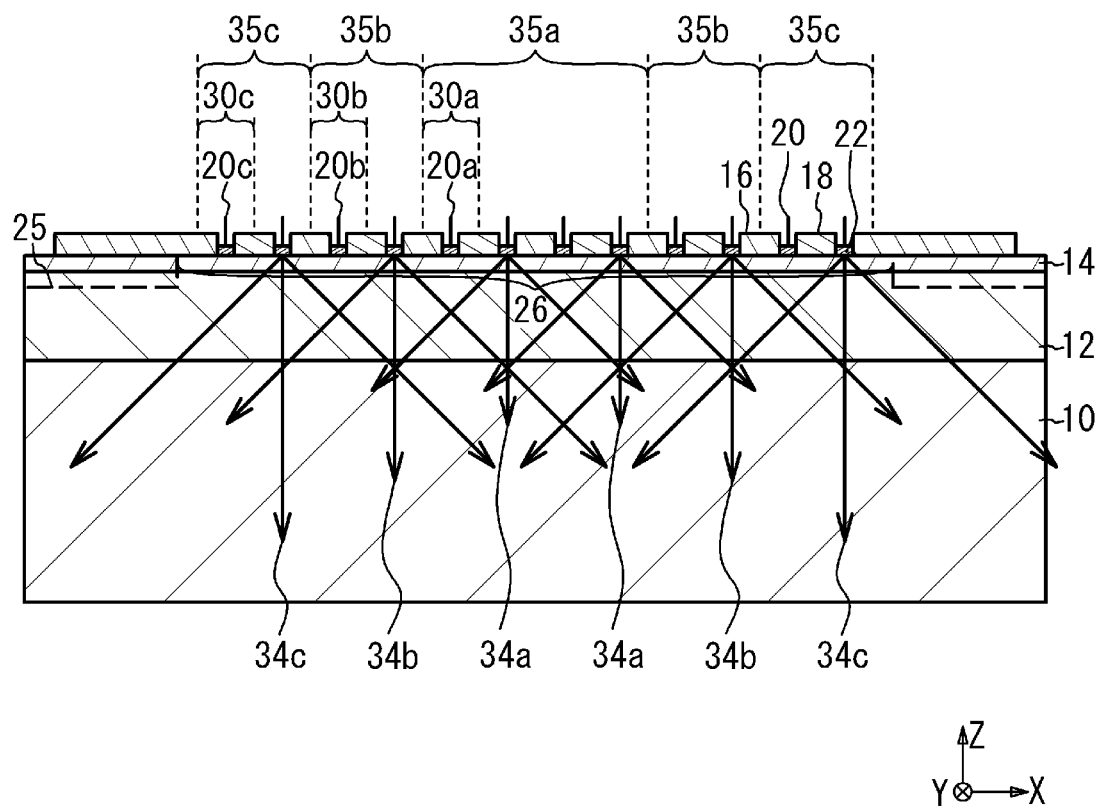
FIG. 2 is a cross-sectional view taken along line A-A of FIG. 1.

A first embodiment is an example of a FET used in a high frequency power amplifier. FIG. 1 is a plan view of the FET according to the first embodiment. FIG. 2 is a cross-sectional view taken along line A-A of FIG. 1. An arrangement direction of a plurality of gate fingers 20 is an X direction, an extension direction thereof is a Y direction, and a normal direction of a substrate 10 (i.e., a vertical direction perpendicular to an upper surface of the substrate 10) is a Z direction.

As illustrated in FIGS. 1 and 2, a semiconductor layer 12 is provided on the substrate 10, and a semiconductor layer 14 is provided on the semiconductor layer 12.

In the case of GaN-HEMT, the substrate 10 is, for example, a SiC substrate, a sapphire substrate, a GaN substrate or a diamond substrate. The thickness of the substrate 10 is, for example, 1 μm to 100 μm. The semiconductor layers 12 and 14 are GaN-based semiconductor layers having a Ga-polarity upper surface, and are, for example, a GaN layer and an AlGaN (Al composition ratio is, for example, 0.3) layer, respectively. The semiconductor layer 14 may be an AlGaN layer and a GaN layer provided on the AlGaN layer. The thicknesses of the semiconductor layers 12 and 14 are, for example, 500 nm and 10 nm, respectively. A 2DEG (two-dimensional electron gas: Two Digital Electron Gas) 13 (see FIG. 3) is formed in the vicinity of an interface with the semiconductor layer 14 in the semiconductor layer 12. The 2DEG functions as a channel layer.

In a plan view from the Z direction, source fingers 16 and drain fingers 18 are alternately arranged in the X direction on the semiconductor layer 14. An insulating film 22 is provided on the semiconductor layer 14 between the source finger 16 and the drain finger 18. The gate fingers 20 are provided on the insulating film 22. The gate finger 20 is sandwiched between the source finger 16 and the drain finger 18.

The source finger 16 is provided on the lower surface of the substrate 10 by a through electrode 17 penetrating the substrate 10, and is electrically connected and short-circuited to a metal layer (not illustrated) to which a ground potential is supplied. The plurality of drain fingers 18 are commonly connected to a drain connection wiring 19 at a −Y end (an end in a downward direction of a Y axis in FIG. 1). The plurality of gate fingers 20 are commonly connected to a gate connection wiring 21 at a +Y end (an end in an upward direction of the Y axis in FIG. 1). The source finger 16, the drain finger 18 and the gate finger 20 are provided on an active region 26. The active region 26 is a region in which the semiconductor layer 14 is activated. There is an inactive region 25 outside the active region 26. In the inactive region 25, ions are implanted into the semiconductor layer 14. The drain connection wiring 19 and the gate connection wiring 21 are provided on the inactive region 25.

The source finger 16 and the drain finger 18 are a metal film, and includes, for example, a titanium film and an aluminum film from a position near the semiconductor layer 14. The gate finger 20 is a metal film, and includes, for example, a nickel film and a gold film from the position near the semiconductor layer 14. The drain connection wiring 19 and the gate connection wiring 21 are, for example, a metal layer of a gold layer. The insulating film 22 is, for example, an oxide film, a nitride film or a nitride oxide film including at least one of aluminum, silicon, hafnium and titanium, and is an aluminum oxide film as an example.

A region 35a is provided in a central portion of the plurality of unit FETs in the X direction, and regions 35c are provided in peripheral portions of the active region 26 in the X direction. Regions 35b are provided between the regions 35a and 35c. The source finger 16, the drain finger 18, and the gate finger 20 form each of the unit FETs 30a to 30c. At least one of the unit FETs 30a to 30c is provided in each of the regions 35a to 35c. The unit FET 30a is provided in the region 35a, the unit FET 30b is provided in the region 35b, and the unit FET 30c is provided in the region 35c. The units FETs 30a to 30c include gate fingers 20a to 20c, respectively. In FIGS. 1 and 2, the number of units FETs 30a to 30c is 12 in total. The total number of units FETs 30a to 30c can be appropriately set.

Figure 3:
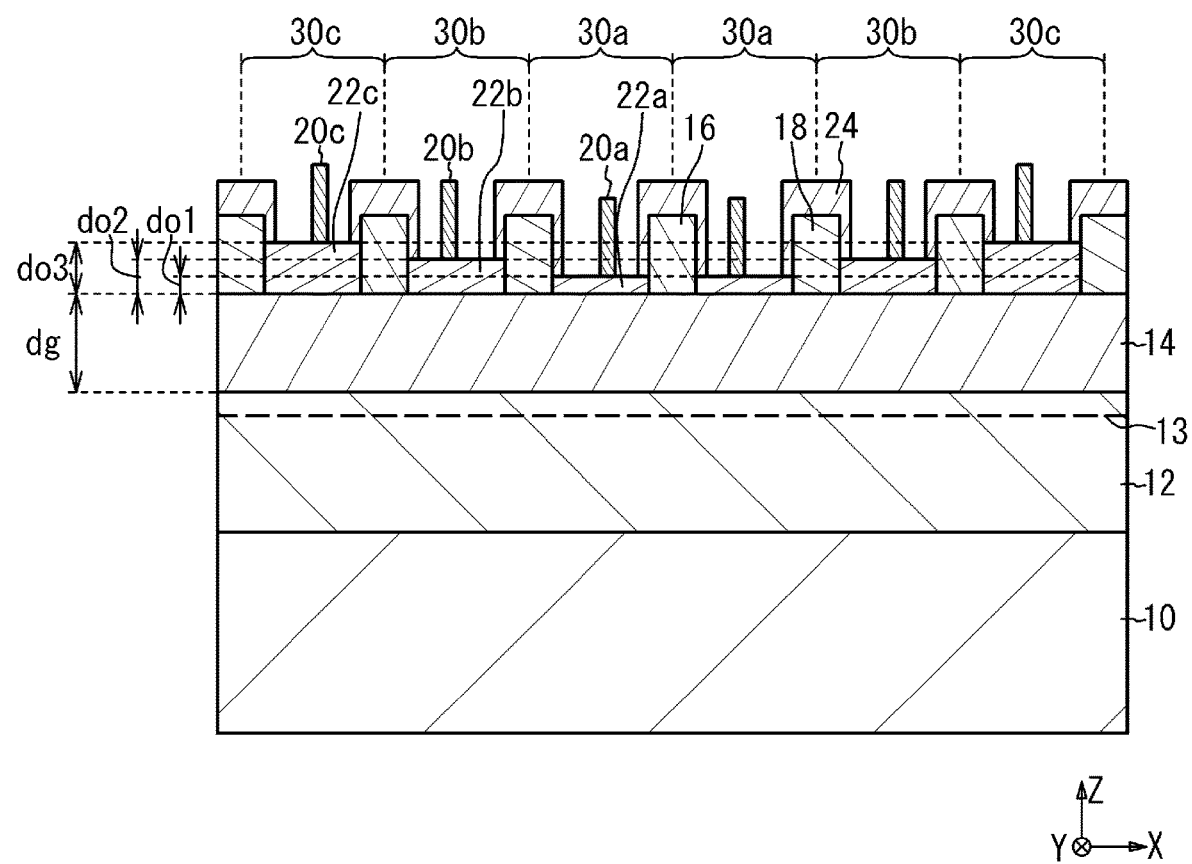
FIG. 3 is a cross-sectional view of a unit FET according to the first embodiment.

FIG. 3 is a cross-sectional view of the unit FET according to the first embodiment. In FIG. 3, each of the unit FETs 30a-30c is illustrated in two pieces. As illustrated in FIG. 3, in the unit FET 30a, an insulating film 22a is provided between the semiconductor layer 14 and the gate finger 20a. In the unit FET 30b, an insulating film 22b is provided between the semiconductor layer 14 and the gate finger 20b. In the unit FET 30c, an insulating film 22c is provided between the semiconductor layer 14 and the gate finger 20c. The thicknesses of the insulating films 22a to 22c are do1 to do3, respectively, and the magnitude of the thicknesses is do1<do2<do3. The insulating films 22a to 22c contain the same material as a main component. A thickness dg of the semiconductor layer 14 is constant regardless of the units FETs 30a to 30c. A protective film 24 is provided so as to cover the source finger 16 and the drain finger 18. The protective film 24 is an insulating film such as a silicon nitride film. In FIG. 3, the gate finger 20 is provided closer to the source finger 16 than the drain finger 18 in order to increase a drain breakdown voltage. The gate finger 20 may be provided near a midpoint between the drain finger 18 and the source finger 16.

Figure 4:
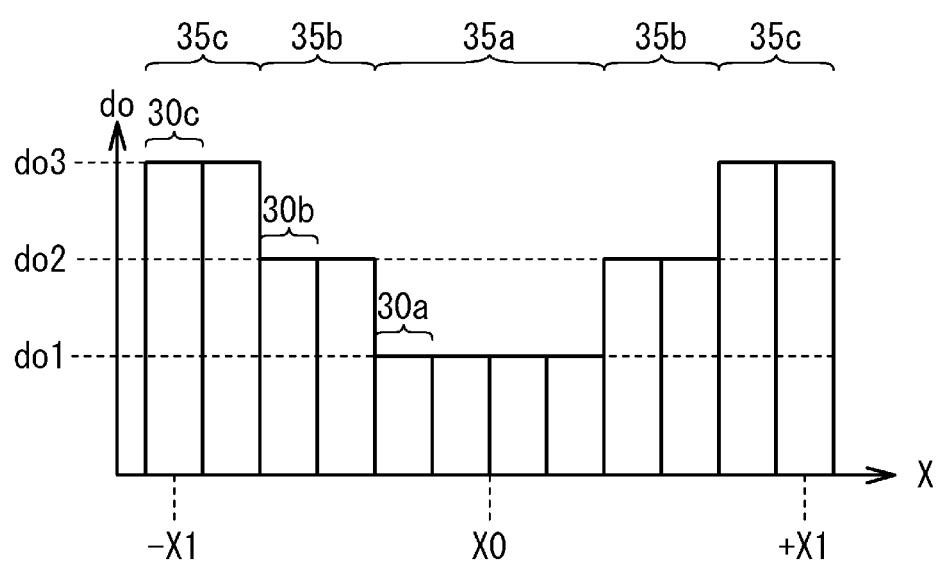
FIG. 4 is a diagram illustrating thicknesses do of insulating films with respect to a position in an X direction according to the first embodiment.

FIG. 4 is a diagram illustrating the thickness do of the insulating film with respect to a position in the X direction according to the first embodiment. A horizontal axis indicates the positions X of the unit FETs 30a to 30c in the X direction, and a vertical axis indicates the thicknesses do of the insulating films 22a to 22c. One rectangle extending in the vertical direction corresponds to one of the unit FETs 30a to 30c. The positions of the gate fingers of the outermost unit FETs are +X1 and −X1, respectively. A position of the midpoint between +X1 and −X1 is indicated by a center X0 in the X direction of the plurality of gate fingers 20. As illustrated in FIG. 4, four unit FETs 30a are provided in the region 35a, two unit FETs 30b are provided in each of the two regions 35b on a +X side and a −X side, and a total of four unit FETs 30b are provided in the two regions 35b. Two unit FETs 30c are provided in each of the two regions 35c on the +X side and the −X side, and a total of four unit FETs 30c are provided in the two regions 35c. The thicknesses of the insulating films 22a to 22c in the regions 35a to 35c are do1 to do3, respectively.

Figure 5:
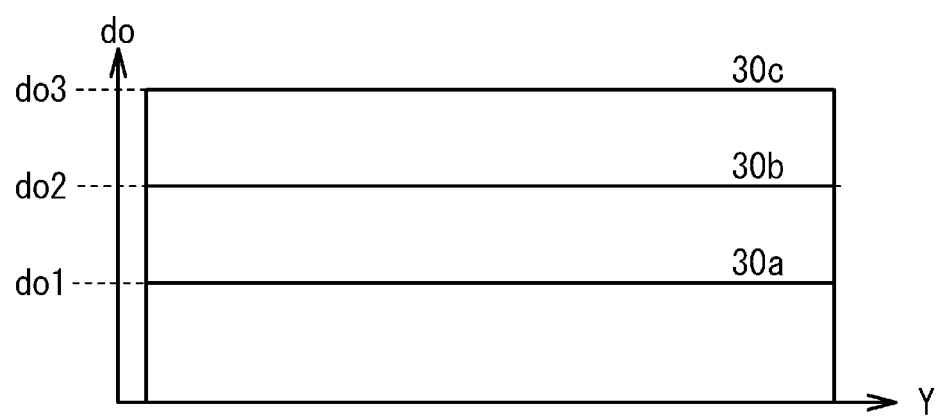
FIG. 5 is a diagram illustrating the thicknesses do of the insulating films with respect to a position in a Y direction according to the first embodiment.

FIG. 5 is a diagram illustrating the thicknesses do of the insulating films with respect to a position in the Y direction according to the first embodiment. The horizontal axis indicates a position Y in the Y direction in one of the unit FETs 30a to 30c, and the vertical axis indicates the thicknesses do of the insulating films 22a to 22c. As illustrated in FIG. 5, in the unit FET 30a, the thickness of the insulating film 22a is uniform regardless of the position Y and is do1. Even in the units FETs 30b and 30c, the thicknesses of the insulating films 22b and 22c are uniform and are do2 and do3, respectively.

Figure 6:
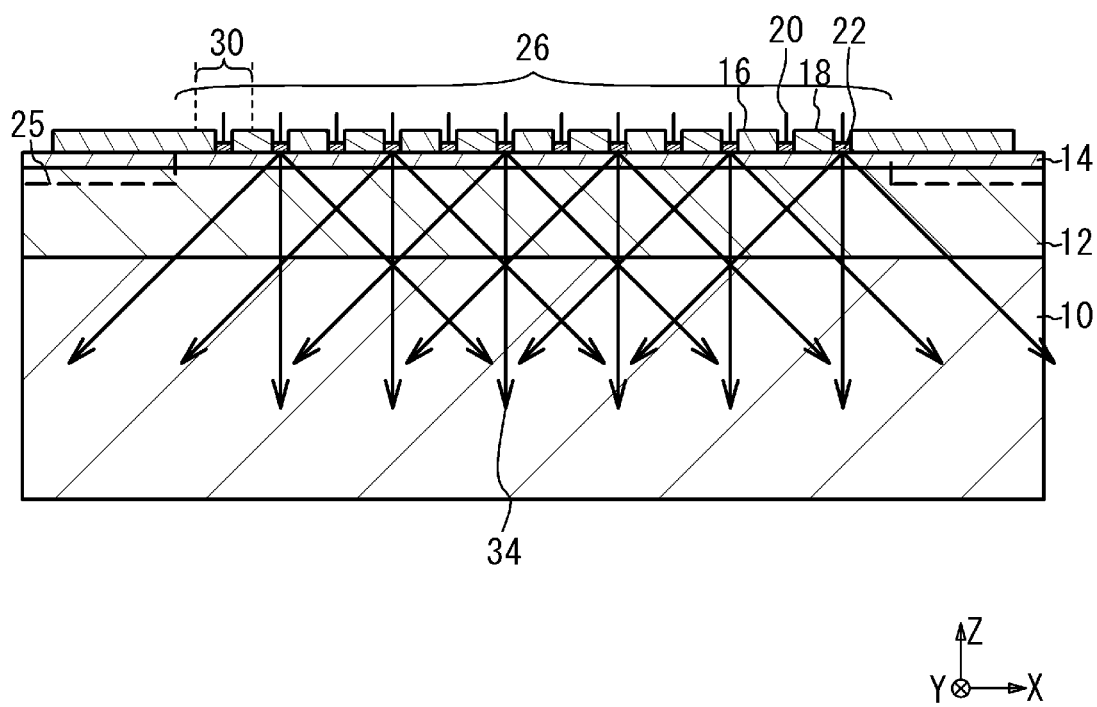
FIG. 6 is a cross-sectional view of the unit FET according to a first comparative example.

FIG. 6 is a cross-sectional view of the unit FET according to a first comparative example. In first comparative example, the thicknesses of the insulating films 22 in all the unit FETs 30 are constant. When the FET is operated, heat is generated by a current flowing through the semiconductor layer 14 under the gate finger 20. The heat diffusion from each unit FET 30 spreads approximately in the range of an angle of 45° with respect to the −Z direction as illustrated by arrows 34. In FIG. 6, arrows are illustrated every other arrow for the gate fingers 20 for convenience of viewing the figure. In reality, heat is diffused from each of all the gate fingers 20 as illustrated by the arrow 34. In a central portion of the active region 26 in the X direction, the heat diffusion radiated from each unit FET 30 overlaps each other, and the central portion of the active region 26 becomes hot. On the other hand, the overlap of heat diffusion in peripheral portions of the active region 26 in the X direction is smaller than that in the central portion, and the peripheral portions of the active region 26 are not as hot as the central portion. When the central portion of the active region 26 becomes hot, the resistance of the 2DEG 13 in the central portion increases, and the output power decreases. In addition, electrons are emitted from an electron capture level near the 2DEG 13, which changes the electrical characteristics. On the other hand, if the current density of each unit FET 30 is lowered in order to suppress the temperature in the central portion of the active region 26, a chip area is increased in order to obtain a desired value for the output power of the entire chip, which increases the size of the semiconductor device.

A drain current with respect to a gate voltage Vg of the unit FET when the thickness do of the insulating film 22 was changed was calculated. A global approximation was used for the calculation. The drain current Id can be obtained by Equation 1.

$$Id=(\varepsilon\mu W/Lg)((Vg'-Vth)Vd'-Vd'^2/2) \quad \text{(Equation 1)}$$

Wherein "ε" is a dielectric constant of the semiconductor layer 12, "μ" is an electron mobility of 2DEG 13, "W" is a gate width (a width of the active region 26 in the Y direction), "Lg" is a gate length of the gate finger 20 (a length in the X direction), "Vg'" is an effective gate voltage, "Vd'" is an effective drain voltage, and "Vth" is a threshold voltage.

The effective gate voltage Vg' is expressed by Equation 2.

$$Vg'=Vg-Id\times(Rs+Rc) \quad \text{(Equation 2)}$$

The effective drain voltage Vd' is expressed by Equation 3.

$$Vd'=Vd-Id\times(Rs+Rd+2Rc) \quad \text{(Equation 3)}$$

Wherein "Vg" is a gate voltage, "Vd" is a drain voltage, "Rs" is a source resistance, "Rd" is a drain resistance, and "Rc" is a contact resistance.

The threshold voltage Vth is expressed by Equation 4.

$$Vth=(Q/C) \quad \text{(Equation 4)}$$

Wherein "Q" is an accumulated charge and "C" is a combined capacitance value. The "Q" is a constant value, and the combined capacitance value is expressed by Equation 5.

$$1/C=1/Co+1/Cg \quad \text{(Equation 5)}$$

Wherein "Co" is a capacitance value of the insulating film 22, and "Cg" is a capacitance value of the semiconductor layer 14. The "Co" and the "Cg" are expressed by Equation 6.

$$Co=\varepsilon o/do, Cg=\varepsilon g/dg \quad \text{(Equation 6)}$$

Wherein "εo" is a dielectric constant of the insulating film 22, and "εg" is a dielectric constant of the semiconductor layer 14.

Figure 7:
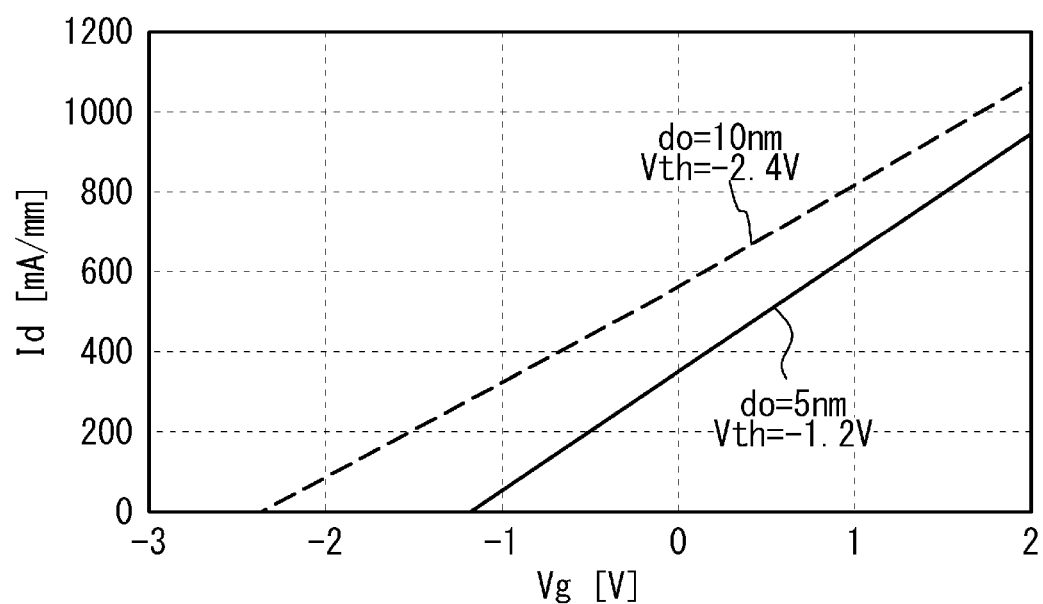
FIG. 7 is a diagram illustrating an Id-Vg characteristic in the unit FET.

Id-Vg characteristic was calculated by using the semiconductor layer 12 as a GaN layer, the semiconductor layer 14 as an AlGaN layer, and the insulating film 22 as the aluminum oxide film. FIG. 7 is a diagram illustrating the Id-Vg characteristic in the unit FET. A horizontal axis is a gate voltage Vg, and a vertical axis is a drain current Id. As illustrated in FIG. 7, when the thickness do of the insulating film 22 is 5 nm, the threshold voltage Vth is −1.2 V. When the thickness do of the insulating film 22 is 10 nm, the threshold voltage Vth is −2.4V. Thus, as the thickness do of the insulating film 22 becomes thicker, the threshold voltage Vth becomes deeper and the drain current Id at the same gate voltage Vg becomes larger.

As another example, assuming that the semiconductor layer 14 is an AlGaN layer having an Al composition ratio of 0.3, the thickness dg is 10 nm, and the insulating film 22 is an aluminum oxide film having a relative dielectric constant of 9, when the thicknesses do of the insulating film 22 are 5 nm, 7 nm and 10 nm, the threshold voltages Vth are −3V, −3.4V and −4V, respectively. If the thickness do is too thick, the FET may not be able to pinch off when the gate length is short. From this viewpoint, the thickness do of the insulating film 22 is preferably 10 nm or less. If the thickness do is too thin, the gate leakage current increases. From this viewpoint, the thickness do is preferably 5 nm or more. If a difference "do3−do1" is too small, a difference in current density between the unit FETs 30c and 30a is too small. Therefore, the difference between the maximum thickness do3 and the minimum thickness do1 of the thickness do is preferably 5 nm or more. If the difference "do3−do1" is large, the unit FET 30c cannot be pinched off. Therefore, the difference "do3−do1" is preferably 8 nm or less.

Figure 8:
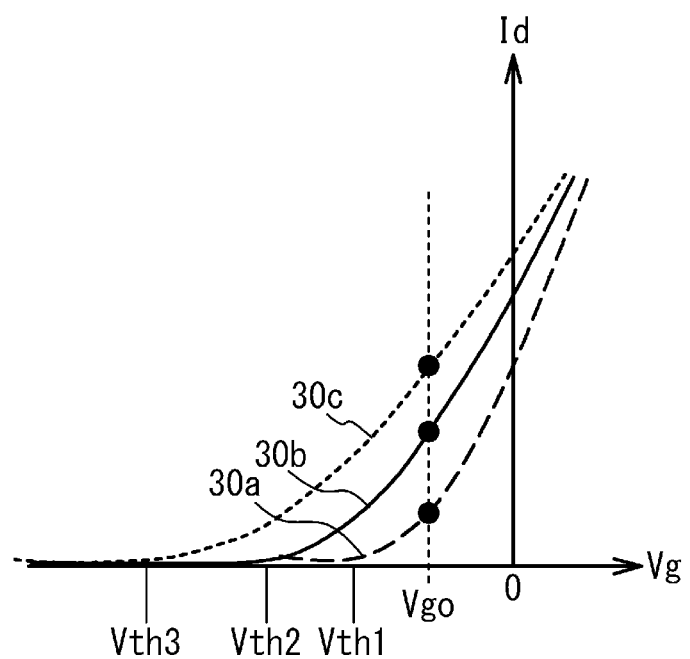
FIG. 8 is a diagram illustrating an Id-Vg characteristic in each unit FET according to the first embodiment.
Figure 9:
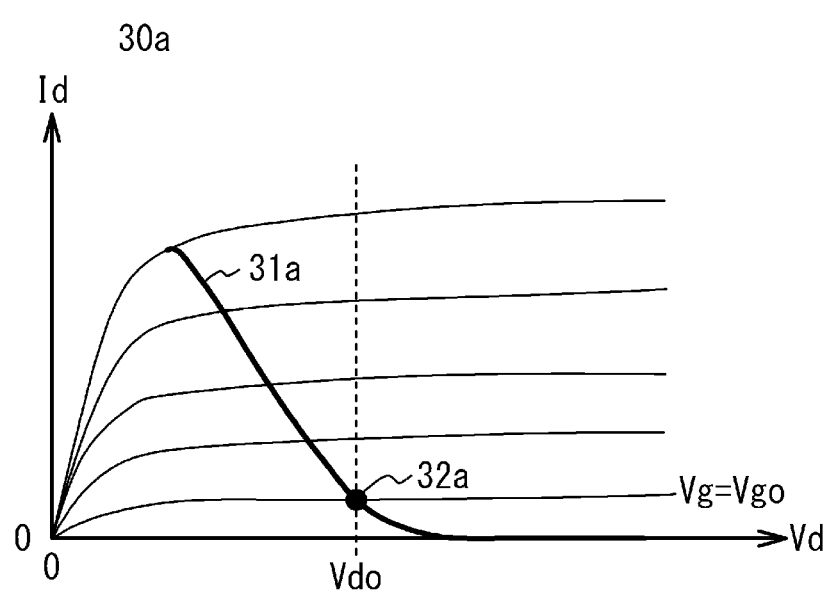
FIG. 9 is a diagram illustrating an Id-Vg characteristic in a unit FET 30a according to the first embodiment.
Figure 10:
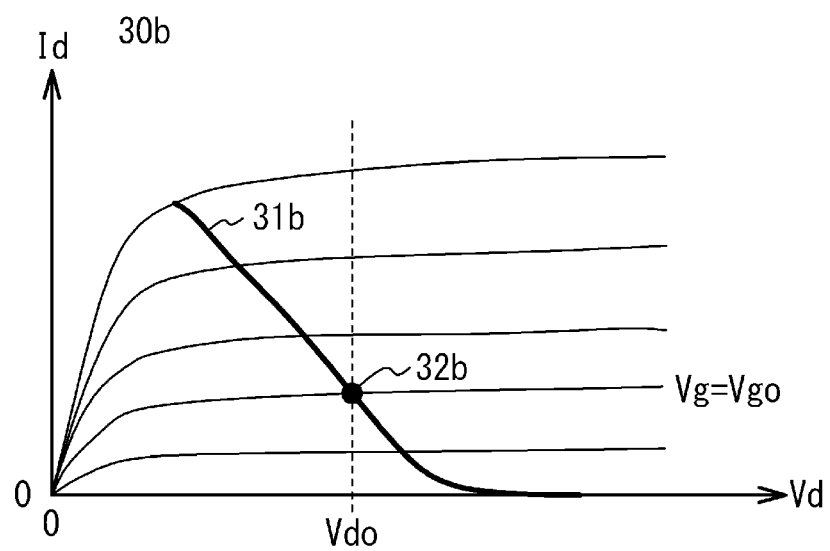
FIG. 10 is a diagram illustrating an Id-Vg characteristic in a unit FET 30b according to the first embodiment.
Figure 11:
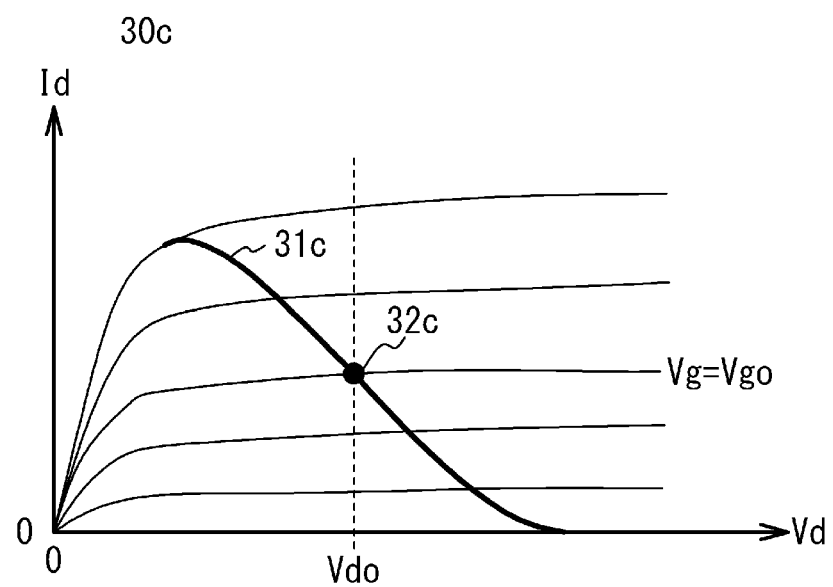
FIG. 11 is a diagram illustrating an Id-Vg characteristic in a unit FET 30c according to the first embodiment.

FIG. 8 is a diagram illustrating an Id-Vg characteristic in each unit FET according to the first embodiment. FIGS. 9 to 11 are diagrams illustrating Id-Vg characteristics in the unit FETs 30a to 30c according to the first embodiment, respectively.

As illustrated in FIG. 8, the thickness do2 of the insulating film 22b in the unit FET 30b is thicker than the thickness do1 of the insulating film 22a in the unit FET 30a. Therefore, a threshold voltage Vth2 of the unit FET 30b is deeper (that is, negatively larger) than a threshold voltage Vth1 of the unit FET 30a. Similarly, the thickness do3 of the insulating film 22c in the unit FET 30c is thicker than the thickness do2 of the insulating film 22b in the unit FET 30b. Therefore, a threshold voltage Vth3 of the unit FET 30c is deeper than the threshold voltage Vth2 of the unit FET 30b. If the gate voltage Vg at an operating point is Vgo, the drain current Id at Vgo is larger in the unit FET 30b than in the unit FET 30a, and larger in the unit FET 30c than in the unit FET 30b.

As illustrated in FIG. 9, Vd=Vdo at Vg=Vgo is an operating point 32a. A load curve 31a when a large high frequency power is applied to the gate in the unit FET 30a is centered at the operating point 32a.

As illustrated in FIG. 10, in the unit FET 30b, the drain current Id at an operating point 32b is larger than the drain current Id at the operating point 32a in the unit FET 30a of FIG. 9. A load curve 31b of the unit FET 30b is centered at the operating point 32b, and is larger in the drain current Id than the load curve 31a of the unit FET 30a.

As illustrated in FIG. 11, in the unit FET 30c, the drain current Id at an operating point 32c is larger than the drain current Id at the operating point 32b of the unit FET 30b in FIG. 10. A load curve 31c of the unit FET 30c is centered at the operating point 32c, and is larger in the drain current Id than the load curve 31b of the unit FET 30b.

As described above, when the high frequency power of the same magnitude is applied to each gate, the current density of the current flowing through each gate increases in an order of the unit FETs 30a to 30c. Therefore, the self-heating when the high frequency power is applied increases in the order of the unit FETs 30a to 30c. Although the length of the arrow 34a in FIG. 2 is shorter than the others to indicate the heat diffusion, the heat diffusion radiated from the unit FET 30a in the region 35a is smaller. Although the length of the arrow 34b is made longer to indicate the heat diffusion, the heat diffusion radiated from the unit FET 30b in the region 35b is larger than that from the unit FET 30a. As illustrated by the longest length of the arrow 34c, the heat diffusion radiated from the unit FET 30c in the region 35c is further greater than that from the unit FET 30b.

In this way, in the region 35a near the center of the active region 26 in the plurality of unit FETs 30a to 30c, the heat diffusion radiated from the unit FET 30a is suppressed to be smaller, and in the region 35c near the peripheral edge of the active region 26 in the plurality of unit FETs 30a to 30c, the heat diffusion radiated from the unit FET 30c becomes larger. This can suppress the increase in temperature near the center of the active region 26 in the unit FET 30. That is, since the current density of the unit FET 30a can be suppressed and the current densities of the unit FETs 30c and 30b can be increased, the increase in temperature near the center of the plurality of gate fingers can be suppressed while securing the desired output power required for the chip without increasing the chip area.

Here, the units FETs 30a to 30c are connected in parallel between the gate connection wiring 21 and the drain connection wiring 19. In unit FETs 30a-30c, the mixture of Class B and Class A operation makes the design of the distortion difficult. Therefore, it is preferable that the units FETs 30a to 30c operate in class A or class AB. That is, it is preferable that the gate voltage Vgo at the operating points 32a to 32c is larger than the threshold voltages Vth1 to Vth3.

FIGS. 12 to 17 are diagrams illustrating another examples (examples 1 to 6) of the thicknesses do of the insulating films with respect to the position in the X direction according to the first embodiment. As illustrated in FIGS. 12 to 15, the thickness do of the insulating film 22 may be two levels such as do1 and do2. Here, the level refers to conditions of the thickness when structurally the same layer or the same film includes parts having different thicknesses. Here, the same layer or the same film includes not only a single layer or a single film, but also a plurality of films, a plurality of layers, or a combination of layers and films which can be regarded as structurally the same. To make the thickness do of the insulating film 22 different, the manufacturing man-hours increase. From this viewpoint, the thickness do of the insulating film 22 has preferably two levels.

Figure 12:
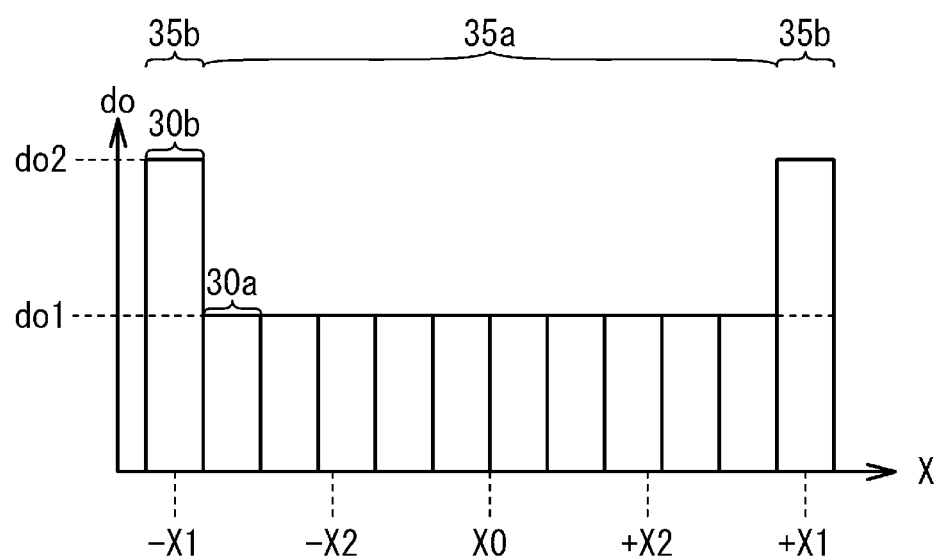
FIG. 12 is a diagram illustrating an example 1 of the thicknesses do of the insulating films with respect to the position in the X direction according to the first embodiment.
Figure 13:
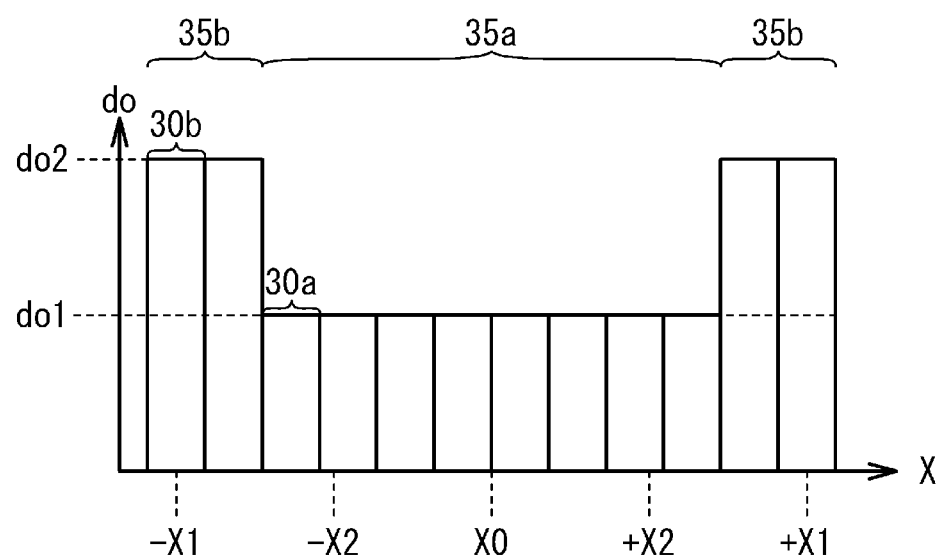
FIG. 13 is a diagram illustrating an example 2 of the thicknesses do of the insulating films with respect to the position in the X direction according to the first embodiment.
Figure 14:
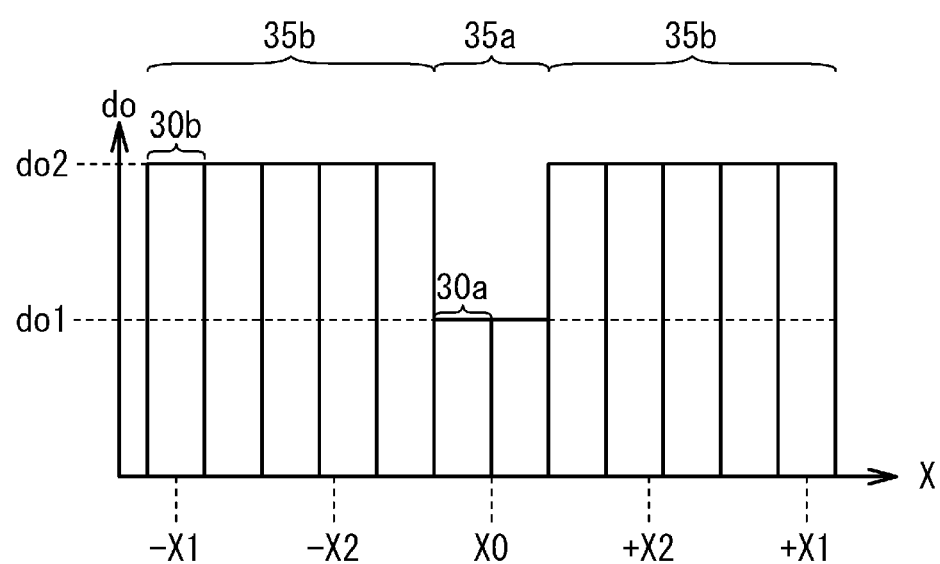
FIG. 14 is a diagram illustrating an example 3 of the thicknesses do of the insulating films with respect to the position in the X direction according to the first embodiment.

As illustrated in FIG. 12, the outermost unit FETs 30b among the unit FETs may have the thickness of do2, and the other unit FETs 30a may have the thickness of do1. As illustrated in FIG. 13, the outer two unit FETs 30b among the unit FETs may have the thickness of do2, and the other unit FETs 30a may have the thickness of do1. As illustrated in FIG. 14, the unit FETs 30a near the center X0 among the unit FETs may have the thickness of do1, and the other unit FETs 30b may have the thickness of do2.

In the first comparative example of FIG. 6, the heat diffusion is illustrated by the arrow 34. Since the thickness of the insulating film 22 in all the unit FETs 30 is constant, FIG. 6 illustrates that the heat diffusion is equally generated from all the unit FETs 30 in the central portion of the active region 26 as well as in the peripheral portion of the active region 26. Therefore, the heat dissipation paths overlap over a wide range of the active region 26. This causes the temperature to increase over the wide range in the central portion of the active area 26. Therefore, as illustrated in FIGS. 12 and 13, the thicknesses do of the unit FETs in a region between a position +X2 of a midpoint between +X1 and X0 in the X direction and a position −X2 of a midpoint between −X1 and X0 are preferably thinner than the thicknesses do of the outermost units FET 30b.

Figure 15:
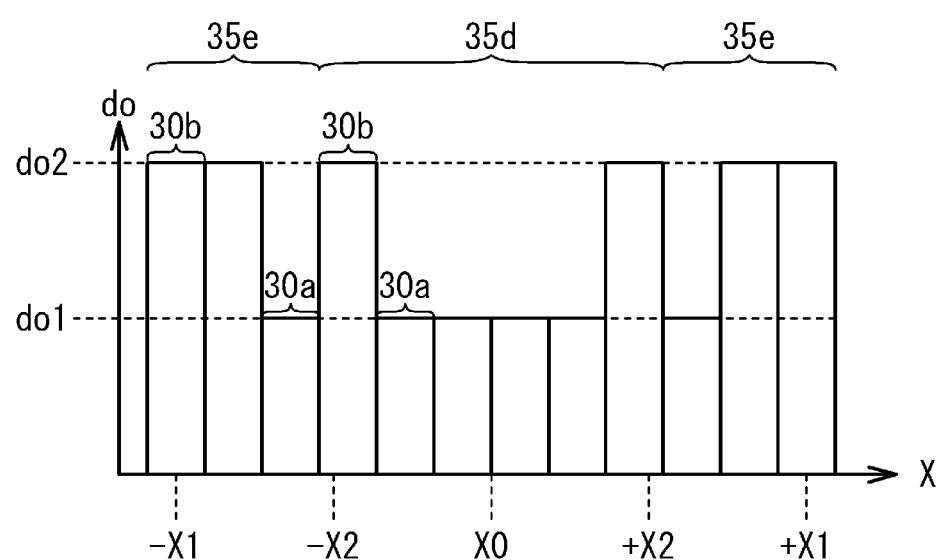
FIG. 15 is a diagram illustrating an example 4 of the thicknesses do of the insulating films with respect to the position in the X direction according to the first embodiment.

As illustrated in FIG. 15, when a region between the positions −X2 and +X2 is 35d and regions between the positions −X1 and −X2 and between the positions +X2 and +X1 are 35e, the units FET 30a and 30b may be mixed in each of the regions 35d and 35e. It is preferable that an average thickness do of the unit FETs in the region 35e is thicker than an average thickness do of the unit FETs in the region 35d. Thereby, an average calorific value in the region 35d due to the heat diffusion radiated from the unit FETs in the region 35d is smaller than an average calorific value in the region 35e due to the heat diffusion radiated from the unit FETs in the region 35e. Therefore, the increase in temperature in the region 35d can be suppressed.

Figure 16:
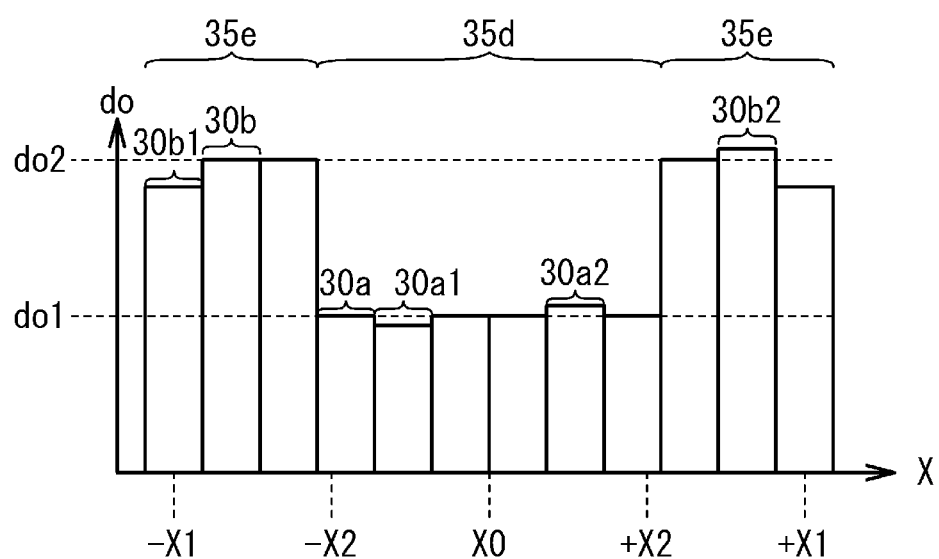
FIG. 16 is a diagram illustrating an example 5 of the thicknesses do of the insulating films with respect to the position in the X direction according to the first embodiment.

As illustrated in FIG. 16, the region 35d may be provided with a unit FET 30a1 having a thickness thinner than the thickness do1 of the unit FET 30a and a unit FET 30a2 having a thickness thicker than the thickness do1. The region 35e may be provided with a unit FET 30b1 having a thickness thinner than the thickness do2 of the unit FET 30b and a unit FET 30b2 having a thickness thicker than the thickness do2. The thickness do of the insulating film 22 of the unit FET 30b1 having the thinnest thickness do in the region 35e is preferably thicker than the thickness do of the unit FET 30a2 having the thickest thickness do in the region 35d.

Figure 17:
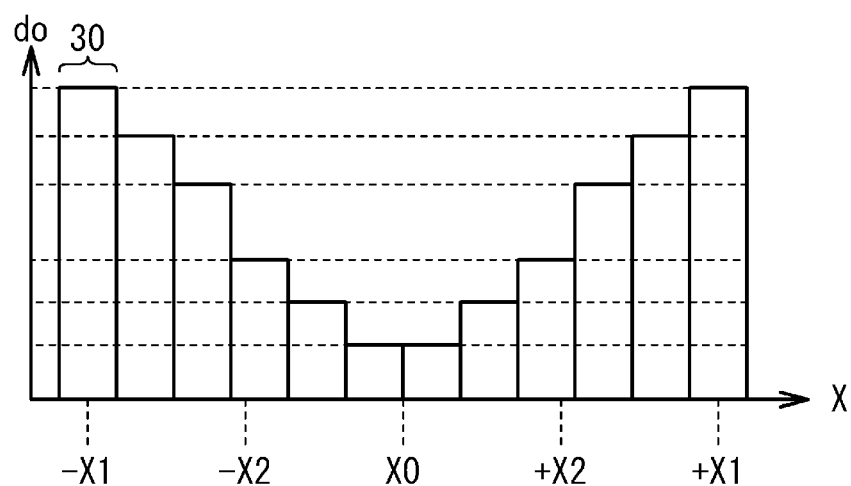
FIG. 17 is a diagram illustrating an example 6 of the thicknesses do of the insulating films with respect to the position in the X direction according to the first embodiment.

As illustrated in FIG. 17, the thickness do of the insulating film 22 of the unit FETs 30 may be thicker from the center X0 toward the outside. Thereby, the increase in temperature due to the heat diffusion radiated from each unit FET 30 can be controlled more finely. Therefore, it is possible to suppress an increase in heat in the central portion of the chip without increasing the size of the semiconductor device.

Second Comparative Example

Figure 18:
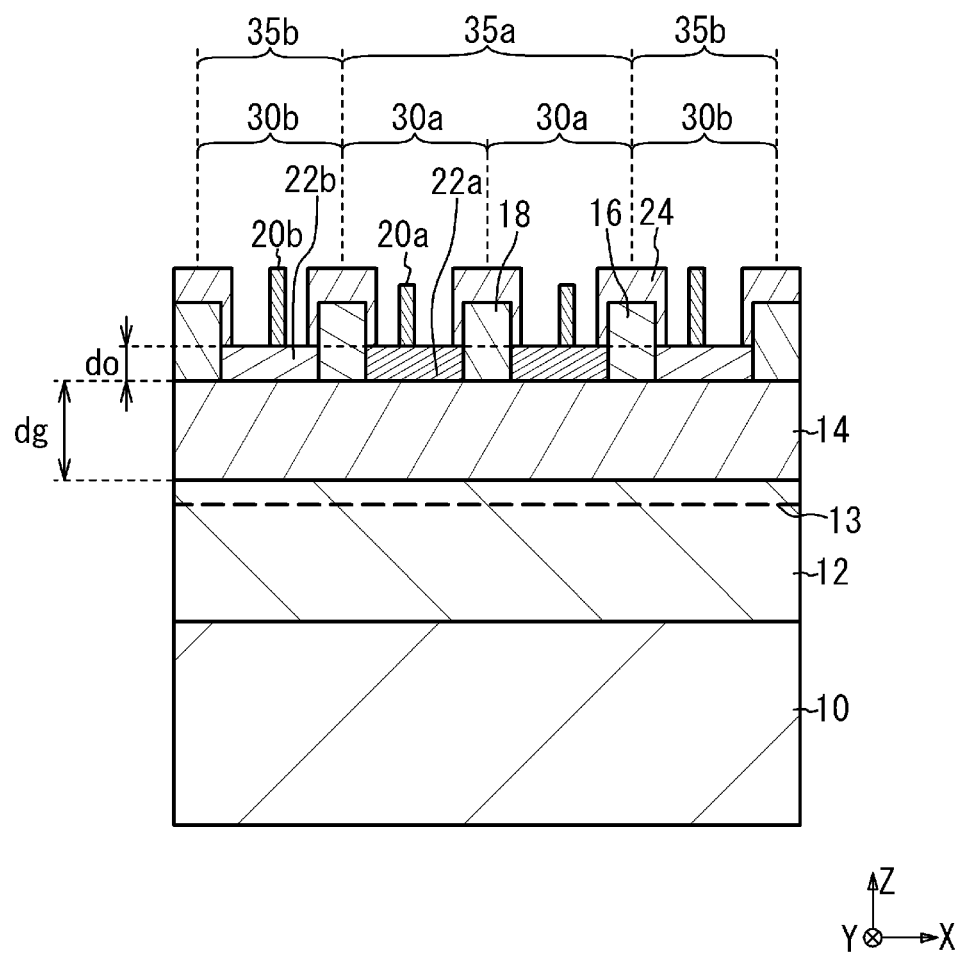
FIG. 18 is a cross-sectional view of a semiconductor device according to a second comparative example.

FIG. 18 is a cross-sectional view of a semiconductor device according to a second comparative example. As illustrated in FIG. 18, the dielectric constant of the insulating film 22a of the unit FET 30a in the region 35a is made smaller than the dielectric constant of the insulating films 22b of the unit FETs 30b in the regions 35b. Thereby, the threshold voltage Vth of the unit FET 30a becomes shallower than the threshold voltage Vth of the unit FET 30b. Therefore, similarly to the first embodiment, the increase in temperature due to the heat diffusion radiated from the unit FET 30a can be made smaller than the increase in temperature due to the heat diffusion radiated from the unit FET 30b. However, it is difficult in the manufacturing process to provide different types of insulating films 22a and 22b as the gate insulating films. Therefore, as in the first embodiment, it is preferable to make the threshold voltages of the unit FETs different depending on the thicknesses of the insulating films 22.

Second Embodiment

Figure 19:
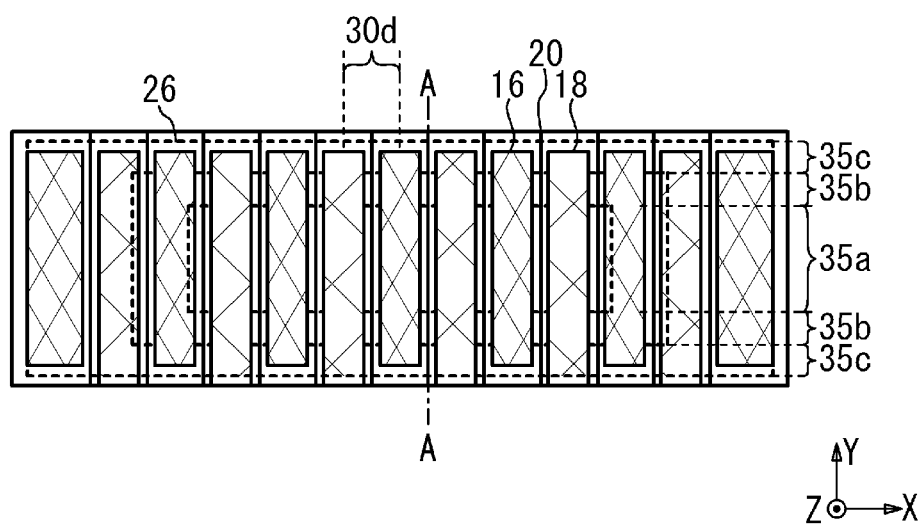
FIG. 19 is a plan view of a region around an active region 26 of a semiconductor device according to a second embodiment.

FIG. 19 is a plan view of a region around the active region 26 of a semiconductor device according to a second embodiment. As illustrated in FIG. 19, in a unit FET 30d provided at the central portion in the X direction, regions 35c are also provided at the peripheral portions in the Y direction. The regions 35b are provided between the region 35a and the regions 35c in the Y direction.

Figure 20:
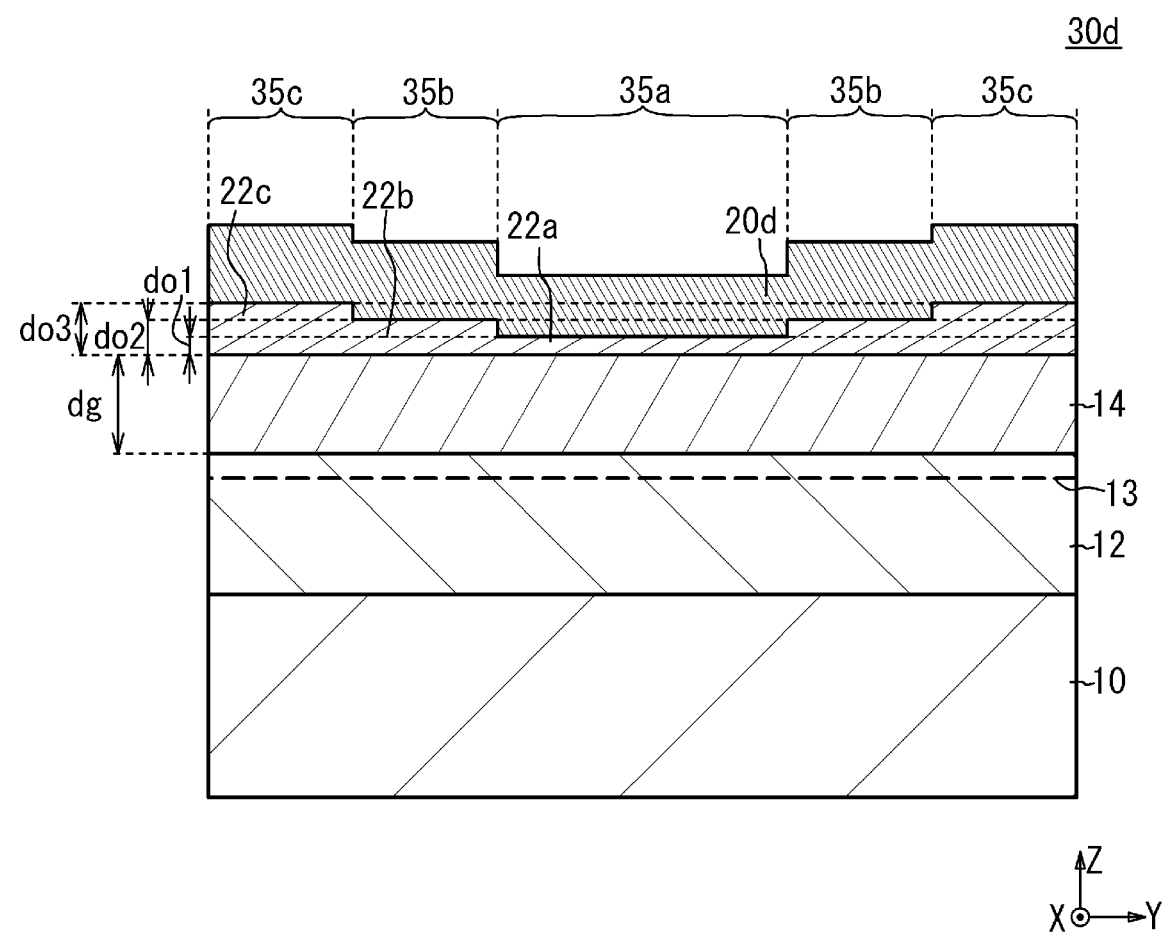
FIG. 20 is a cross-sectional view taken along line A-A of a unit FET 30d in FIG. 19.

FIG. 20 is a cross-sectional view taken along line A-A of the unit FET 30d in FIG. 19. As illustrated in FIG. 20, in the unit FET 30d, the thickness do2 of the insulating film 22b in the region 35b is thicker than the thickness do1 of the insulating film 22a in the region 35a. The thickness do3 of the insulating film 22c in the region 35c is thicker than the thickness do2 of the insulating film 22b in the region 35b. Other configurations are the same as those in the first embodiment, and the description thereof will be omitted.

As in the second embodiment, in the unit FET, the thickness do of the insulating film 22 in the Y direction may be changed in a plurality of steps. In the peripheral portions in the Y direction, the heat radiated from the unit FET 30d is likely to diffuse to the outside, and the temperature of the peripheral portions is less likely to be higher than that of the central portion in the Y direction. Therefore, as in the second embodiment, the thickness do3 of the insulating film 22c at the peripheral portions of the ends in the Y direction is made thicker than the thickness do1 of the insulating film 22a at the central portion in the Y direction. Thereby, the current density in the unit FET 30d can be maintained at a desired value and the increase in temperature at the central portion in the Y direction can be suppressed without increasing the size of the semiconductor device.

Third Embodiment

Figure 21:
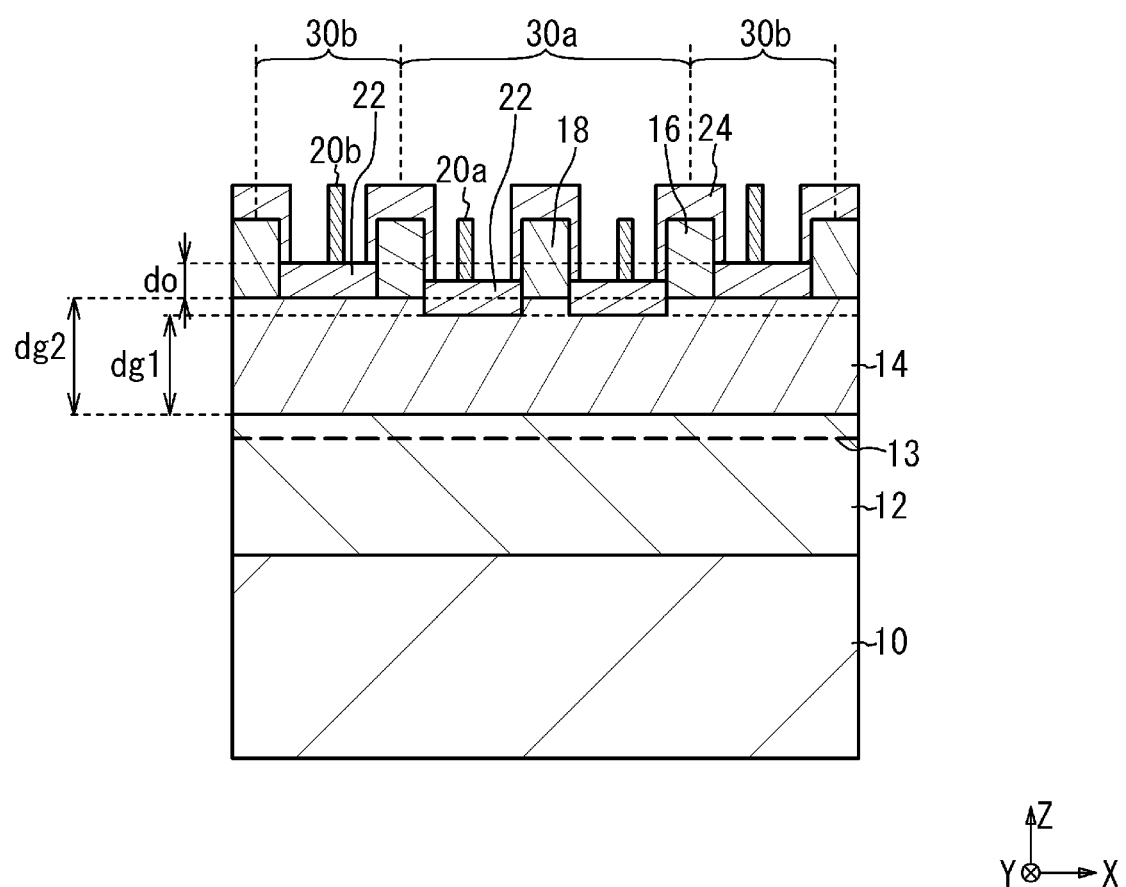
FIG. 21 is a cross-sectional view of a semiconductor device according to a third embodiment.

FIG. 21 is a cross-sectional view of a semiconductor device according to a third embodiment. As illustrated in FIG. 21, in the unit FET 30a at the central portion in the X direction, the thickness of the semiconductor layer 14 is dg1, and in the unit FETs 30b at the peripheral portions, the thickness of the semiconductor layer 14 is dg2. The thickness do of the insulating film 22 in the unit FET 30a is the same as that in the unit FET 30b. Other configurations are the same as those in the first embodiment, and the description thereof will be omitted. As the semiconductor layer 14 becomes thicker, the threshold voltage Vth becomes deeper. Therefore, the threshold voltage Vth of the unit FET 30b becomes deeper than the threshold voltage Vth of the unit FET 30a. Thereby, the current density of the unit FET 30a becomes small, and the heat diffusion radiated from the unit FET 30a becomes small. Therefore, the increase in temperature at the central portion can be suppressed. On the other hand, since the current density of the unit FET 30b can be increased and the current amount of the entire chip can be maintained, it is possible to suppress the increase in size of the semiconductor device.

Fourth Embodiment

Figure 22:
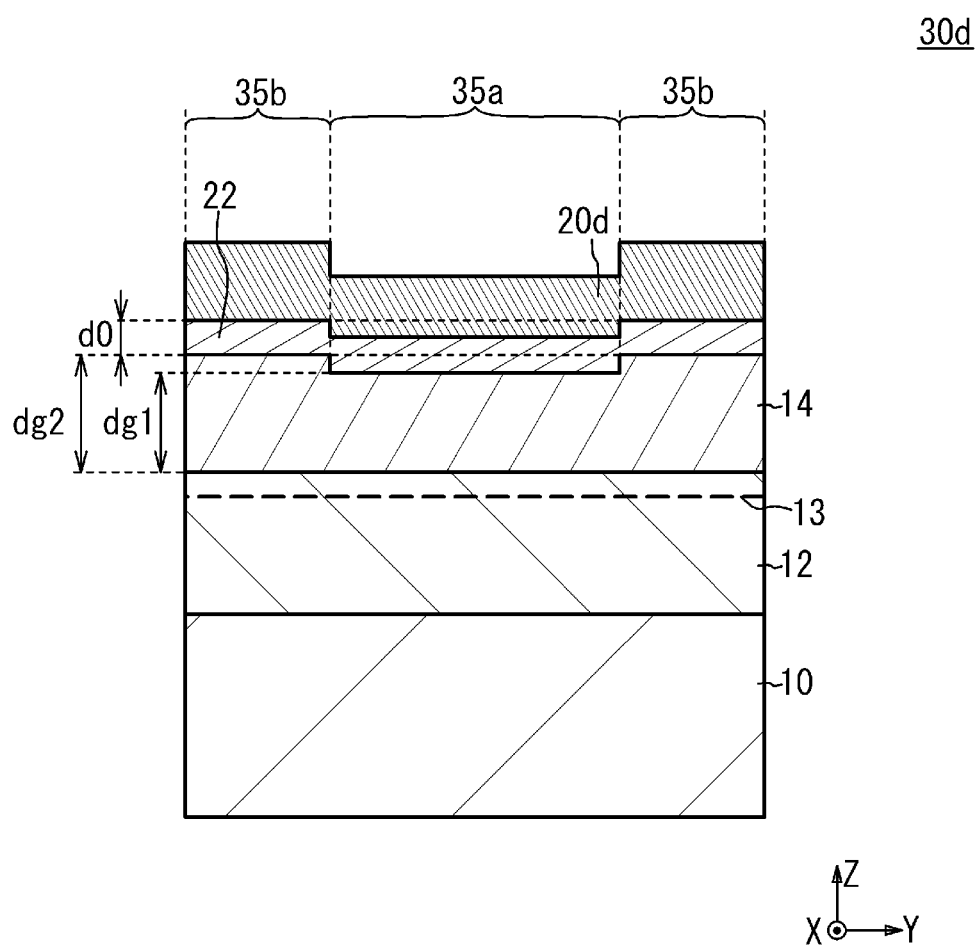
FIG. 22 is a cross-sectional view of a semiconductor device according to a fourth embodiment.

FIG. 22 is a cross-sectional view of a semiconductor device according to a fourth embodiment. As illustrated in FIG. 22, in the unit FET 30d at the central portion in the X direction, the peripheral portions in the Y direction are the regions 35b, and the central portion is the region 35a. The thickness dg2 of the semiconductor layer 14 in the region 35b is made thicker than the thickness dg1 of the semiconductor layer 14 in the region 35a. Other configurations are the same as those in the third embodiment, and the description thereof will be omitted. In the fourth embodiment, the current density in the region 35b becomes higher in the unit FET 30d, and the current density in the unit FET 30d can be made larger than the current density in the first embodiment. Therefore, it is possible to suppress the increase in temperature in the central portion of the chip without increasing the size of the semiconductor device while maintaining the current amount of the entire chip.

In the third and the fourth embodiments, a lower layer of the semiconductor layer 14 may be an AlGaN layer, and an upper layer thereof may be a GaN layer. In region 35a, the GaN layer is etched selectively against the AlGaN layer, so that a recess can be accurately formed in the semiconductor layer 14 of the region 35a.

Fifth Embodiment

Figure 23:
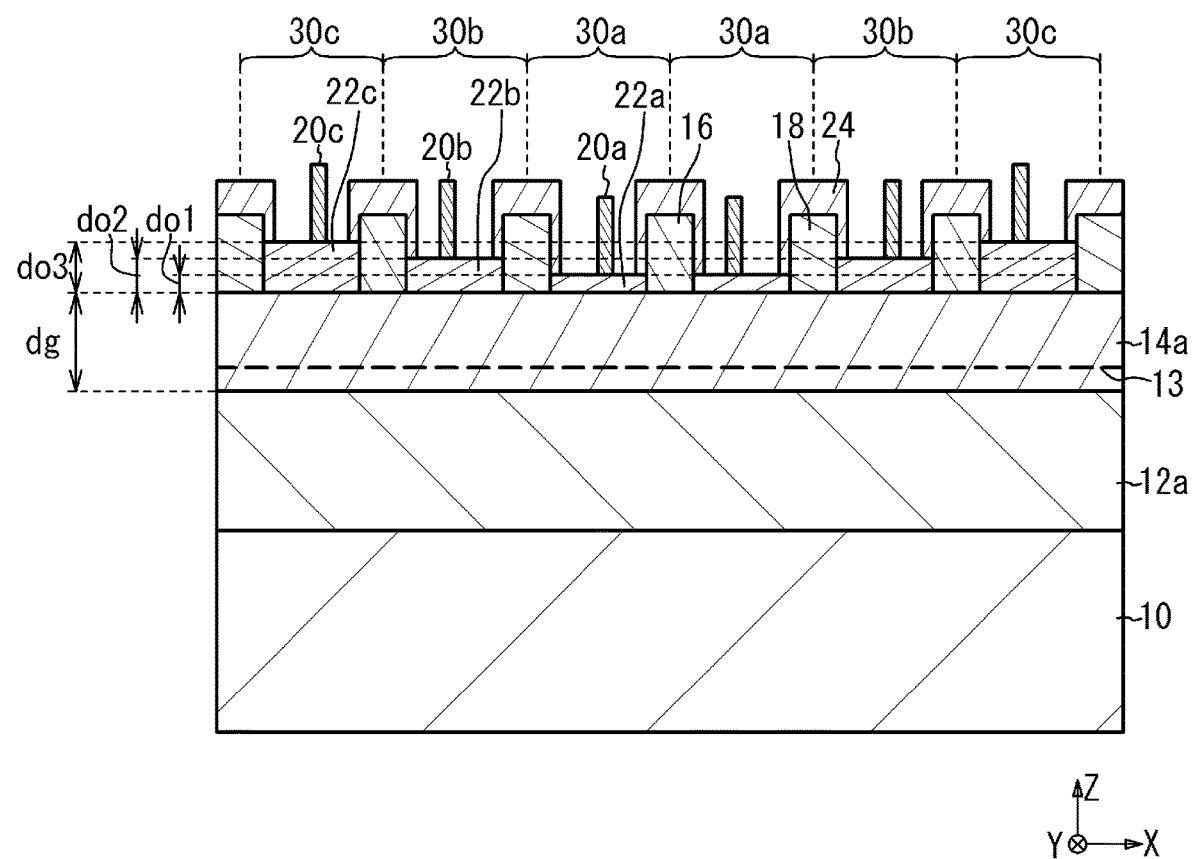
FIG. 23 is a cross-sectional view of a semiconductor device according to a fifth embodiment.

FIG. 23 is a cross-sectional view of a semiconductor device according to a fifth embodiment. As illustrated in FIG. 23, a semiconductor layer 12a is provided on the substrate 10, and a semiconductor layer 14a is provided on the semiconductor layer 12a. The semiconductor layers 12a and 14a are, for example, GaN-based semiconductor layers having N-polarity upper surfaces, and are, for example, an AlGaN layer and a GaN layer, respectively. The 2DEG 13 is formed near an interface with the semiconductor layer 12a in the semiconductor layer 14a. Other configurations are the same as those in the first embodiment, and the description thereof will be omitted. In the second to the fourth embodiments, the semiconductor layers 12a and 14a may be GaN-based semiconductor layers having N-polar upper surfaces.

According to the first to the fifth embodiments, the plurality of gate fingers 20 arranged in the X direction include the gate finger 20c (first gate finger) and the gate finger 20a (second gate finger) closer to the center X0 (center of the plurality of gate fingers 20) than the gate finger 20c, as illustrated in FIGS. 1 to 5. As illustrated in FIG. 3, a first distance between the gate finger 20c and the 2DEG 13 is larger than a second distance between the gate finger 20a and the 2DEG 13. Thereby, the threshold voltage Vth1 of the unit FET 30a including the gate finger 20a becomes shallower than the threshold voltage Vth3 of the unit FET 30c including the gate finger 20c, as illustrated in FIG. 8. Therefore, the current density of the unit FET 30a is smaller than the current density of the unit FET 30c, as illustrated in FIGS. 9 and 11. Therefore, as indicated by the arrow 34a in FIG. 2, the calorific value of the unit FET 30a is reduced, and the increase in temperature in the region 35a can be suppressed. On the other hand, since the current density of the unit FET 30c can be increased, the current amount of the entire chip can be maintained. As a result, the increase in temperature in the central portion of the chip can be suppressed without increasing the chip area.

The 2DEG 13 is formed in the vicinity of the interface between the semiconductor layers 12 and 14. Therefore, the distance between the gate finger 20 and the 2DEG 13 is substantially equal to a total thickness of the thickness do of the insulating film 22 and the thickness DG of the semiconductor layer 14. In order to effectively make the current densities of the unit FETs 30c and 30a different, the first distance is preferably 1.1 times or more, more preferably 1.2 times or more the second distance. If the difference between the first distance and the second distance is too large, the characteristics of any of the unit FETs 30c and 30a deteriorate. Therefore, the first distance is preferably twice or less the second distance. The insulating film 22 may not be provided, but it is preferable to provide the insulating film 22 in order to suppress a leakage current.

As illustrated in FIG. 3 of the first embodiment, the insulating film 22c provided between the gate finger 20c and the semiconductor layer 14 is made thicker than the insulating film 22a provided between the gate finger 20a and the semiconductor layer 14. Thereby, the current density of the unit FET 30a can be made smaller than the current density of the unit FET 30c. For example, the thickness of the insulating films 22a to 22c can be controlled with an accuracy equal to or less than the measurement limit by using a film forming technique such as an ALD (Atomic Layer Deposition) method. Therefore, by making the insulating films 22a to 22c different, the units FETs 30a to 30c can be made different by a simple method. In order to effectively make the current densities of the unit FETs 30c and 30a different, the thickness do3 (first portion) of the insulating film 22c is preferably 1.2 times or more, more preferably 1.4 times or more the thickness do1 (second portion) of the insulating film 22a. If the difference between the thicknesses do3 and do1 is large, the characteristics of any of the unit FETs 30c and 30a deteriorate. Therefore, the thickness do3 is preferably 3 times or less, more preferably twice or less the thickness do1.

As illustrated in FIG. 21 of the third embodiment, the semiconductor layer 14 provided between the gate finger 20b and the 2DEG 13 is made thicker than the semiconductor layer 14 provided between the gate finger 20a and the 2DEG 13. Thereby, the current density of the unit FET 30a can be made smaller than the current density of the unit FET 30b. In order to effectively make the current densities of the unit FET 30b and 30a different, the thickness dg2 (first portion) of the semiconductor layer 14 of the unit FET 30b is preferably 1.2 times or more, preferably 1.4 times or more the thickness dg1 (second portion) of the semiconductor layer 14 of the unit FET 30a. If the difference between the thicknesses dg2 and dg1 is large, the characteristics of any of the unit FETs 30b and 30a deteriorate. Therefore, the thickness do2 is preferably 3 times or less, more preferably twice or less the thickness do1.

As illustrated in FIGS. 1 to 5, the gate finger 20b (third gate finger) is provided between the gate fingers 20a and 20c. A third distance between the gate finger 20b and the 2DEG 13 is smaller than the first distance and larger than the second distance. Thereby, the current density of the unit FET 30b can be made higher than the current density of the unit FET 30a and lower than the current density of the unit FET 30c. Therefore, the temperature of the unit FET 30 can be controlled more precisely.

As illustrated in FIGS. 4, 12 to 14, and 17, in any adjacent gate fingers, a distance (fourth distance) between the gate finger near the center X0 among the adjacent gate fingers and the 2DEG 13 is equal to or less than a distance (fifth distance) between the gate finger far from the center X0 among the adjacent gate fingers and the 2DEG 13. Thereby, the temperature distribution in the plurality of unit FETs 30 can be made more uniform.

As illustrated in FIGS. 15 and 16, when the positions of the midpoints between the center X0 and the positions ±X1 of the outermost fourth gate finger in the X direction are ±X2, an average distance (that is, an average of sixth distances) between the 2DEG 13 and the gate fingers 20 in the first region 35d between the positions X0 and ±X2 is smaller than an average distance (an average of seventh distances) between the 2DEG 13 and the gate fingers 20 in the second regions 35e between the positions ±X2 and ±X1. Thereby, the calorific value of the unit FETs 30 in the region 35d becomes smaller than the calorific value of the unit FETs 30 in the regions 35e. Therefore, the increase in temperature in the region 35d can be suppressed. In order to effectively make the calorific values of the regions 35e and 35d different, the average distance (the average of sixth distances) between the gate fingers 20 and the 2DEG 13 in the region 35d is preferably 0.9 times or less, more preferably 0.8 times or less the average distance (the average of seventh distances) between the gate fingers 20 and the 2DEG 13 in the region 35e. The average distance (the average of sixth distances) between the gate fingers 20 and the 2DEG 13 in the region 35d is preferably 0.5 times or more the average distance (the average of seventh distances) between the gate fingers 20 and the 2DEG 13 in the region 35e.

Increasing the level of distances between the plurality of gate fingers 20 and the 2DEG 13 increases the manufacturing process. From this point of view, the level includes preferably 2 levels or 3 levels. On the other hand, increasing the level of the distances between the plurality of gate fingers 20 and the 2DEG 13 can finely control the current densities of the plurality of unit FETs 30.

As illustrated in FIGS. 12 and 13, a distance (eighth distance) between the gate finger 20 and the 2DEG 13 in the region between the center X0 and the position ±X1 is the smallest in the plurality of levels. That is, all the unit FETs between the center X0 and the positions ±X1 are the unit FETs 30a. The region between the center X0 and the positions ±X1 tends to be high temperature because the heat dissipation paths overlap. Therefore, it is preferable to set the region between the center X0 and the positions ±X1 to the smallest level.

As illustrated in FIG. 20 of the second embodiment and FIG. 22 of the fourth embodiment, a distance (9th distance) between the central portion of the gate finger 20d and the 2DEG 13 in the Y direction is smaller than a distance (10th distance) between the peripheral portions of the gate finger 20d and the 2DEG 13. Thereby, the current density of the unit FET 30d in the peripheral portions can be increased, and the increase in temperature in the central portion of the chip can be suppressed without increasing the size of the semiconductor device while maintaining the desired current value for the entire chip.

As in the first to the fourth embodiments, the plurality of source fingers 16 and the plurality of drain fingers 18 are provided alternately, and the plurality of gate fingers 20 are sandwiched between one of the plurality of source fingers 16 and one of the plurality of drain fingers 18 in the X direction. This makes it possible to form a multi-finger FET.

Further, the channel layer includes the 2DEG 13 formed at the interface between the semiconductor layer 12 (first semiconductor layer) and the semiconductor layer 14 (second semiconductor layer) having a larger bandgap than the semiconductor layer 12. In this case, the distance between the gate finger 20 and the 2DEG 13 corresponds to a distance in the Z direction between the lower surface of the gate finger 20 in contact with the insulating film 22 and the upper surface of the semiconductor layer 12 in contact with the semiconductor layer 14. Further, as in the fifth embodiment, the channel layer includes the 2DEG 13 formed at the interface between the semiconductor layer 14a (first semiconductor layer) and the semiconductor layer 12a (second semiconductor layer) having a larger bandgap than the semiconductor layer 14a. In this case, the distance between the gate finger 20 and the 2DEG 13 corresponds to a distance in the Z direction between the lower surface of the gate finger 20 in contact with the insulating film 22 and the upper surface of the 2DEG 13. Thus, since the 2DEG 13 is formed apart from the gate finger 20, the current density can be changed by changing the thickness of the insulating film 22 or the semiconductor layer 14. In the first to the fifth embodiments, nitride semiconductors are described as examples of the semiconductor layers 12 and 14, but the semiconductor layers 12 and 14 may be GaAs-based semiconductors.

The embodiments disclosed here should be considered illustrative in all respects and not restrictive. The present disclosure is not limited to the specific embodiments described above, but various variations and changes are possible within the scope of the gist of the present disclosure as described in the claims.

What is claimed is:

1. A semiconductor device comprising:
a substrate;
a channel layer provided on the substrate;
a semiconductor layer provided on the channel layer;

a plurality of gate fingers provided on the semiconductor layer and arranged in an arrangement direction in a plan view from a vertical direction perpendicular to an upper surface of the substrate;

a gate connection wiring provided on the semiconductor layer and to which the plurality of gate fingers are commonly connected; and an insulating film provided between the semiconductor layer and the plurality of gate fingers;

wherein the plurality of gate fingers includes:
 a first gate finger; and
 a second gate finger closer to the center of the plurality of gate fingers in the arrangement direction than the first gate finger;

wherein a first distance in the vertical direction between a lower surface of the first gate finger in contact with the insulating film and an upper surface of the channel layer in contact with the semiconductor layer is greater than a second distance in the vertical direction between a lower surface of the second gate finger in contact with the insulating film and the upper surface of the channel layer in contact with the semiconductor layer.

2. The semiconductor device as claimed in claim 1, wherein
a first portion of the insulating film provided between the first gate finger and the semiconductor layer is thicker than a second portion of the insulating film provided between the second gate finger and the semiconductor layer.

3. The semiconductor device as claimed in claim 1, wherein
a first portion of the semiconductor layer provided between the first gate finger and the channel layer is thicker than a second portion of the semiconductor layer provided between the second gate finger and the channel layer.

4. The semiconductor device as claimed in claim 1, wherein
the plurality of gate fingers includes a third gate finger provided between the first gate finger and the second gate finger in a plan view from the vertical direction, and
a third distance in the vertical direction between a lower surface of the third gate finger in contact with the insulating film and the upper surface of the channel layer in contact with the semiconductor layer is smaller than the first distance and larger than the second distance.

5. The semiconductor device as claimed in claim 1, wherein
in any adjacent gate fingers among the plurality of gate fingers in a plan view from the vertical direction, a fourth distance in the vertical direction between a lower surface of a gate finger, among the adjacent gate fingers, near the center in contact with the insulating film and the upper surface of the channel layer in contact with the semiconductor layer is equal to or less than a fifth distance in the vertical direction between a lower surface of a gate finger, among the adjacent gate fingers, far from the center in contact with the insulating film and the upper surface of the channel layer in contact with the semiconductor layer.

6. The semiconductor device as claimed in claim 1, wherein
in a plan view from the vertical direction, an average of sixth distances in the vertical direction between the lower surface of the plurality of gate fingers in contact with the insulating film and the upper surface of the channel layer in contact with the semiconductor layer in a first region between the center and a midpoint between an outermost fourth gate finger in the arrangement direction among the plurality of gate fingers and the center is smaller than an average value of seventh distances in the vertical direction between the lower surface of the plurality of gate fingers in contact with the insulating film and the upper surface of the channel layer in contact with the semiconductor layer in a second region between the midpoint and the fourth gate finger.

7. The semiconductor device as claimed in claim 1, wherein
an eighth distance in the vertical direction between the lower surface of the plurality of gate fingers in contact with the insulating film and the upper surface of the channel layer in contact with the semiconductor layer has a plurality of levels, and
a level of the eighth distance in a region between the center and a midpoint between the center and an outermost fourth gate finger in the arrangement direction among the plurality of gate fingers is the smallest in the plurality of levels.

8. The semiconductor device as claimed in claim 1, wherein
in a plan view from the vertical direction, a ninth distance in vertical direction between a lower surface of a central portion of the second gate finger in contact with the insulating film in an extension direction of the plurality of gate fingers and the upper surface of the channel layer in contact with the semiconductor layer is smaller than a tenth distance in vertical direction between a lower surface of a peripheral portion of the second gate finger in contact with the insulating film in the extension direction and the upper surface of the channel layer in contact with the semiconductor layer.

9. The semiconductor device as claimed in claim 1, further comprising:
a plurality of source fingers provided on the semiconductor layer and arranged in the arrangement direction; and
a plurality of drain fingers provided on the semiconductor layer and alternately provided with the plurality of source fingers in the arrangement direction;
wherein in a plan view from the vertical direction, each of the plurality of gate fingers is sandwiched between one of the plurality of source fingers and one of the plurality of drain fingers in the arrangement direction.

10. The semiconductor device as claimed in claim 1, wherein
the channel layer includes a two-dimensional electron gas formed at an interface between a first semiconductor layer and a second semiconductor layer having a larger bandgap than the first semiconductor layer.

* * * * *